(12) United States Patent
Hirata

(10) Patent No.: US 8,637,835 B2
(45) Date of Patent: Jan. 28, 2014

(54) DRAWING APPARATUS, METHOD OF MANUFACTURING ARTICLE, AND PROCESSING APPARATUS

(75) Inventor: Yoshihiro Hirata, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/530,225

(22) Filed: Jun. 22, 2012

(65) Prior Publication Data
US 2012/0328988 A1  Dec. 27, 2012

(30) Foreign Application Priority Data

Jun. 24, 2011 (JP) ................. 2011-141220

(51) Int. Cl.
*G21K 5/00* (2006.01)
*G03F 7/20* (2006.01)
*H03F 3/08* (2006.01)

(52) U.S. Cl.
USPC .............. 250/396 R; 250/492.22; 250/492.23

(58) Field of Classification Search
USPC .......... 250/296, 396 R, 492.1, 492.2, 492.22, 250/492.23, 492.3
See application file for complete search history.

(56) References Cited

U.S. PATENT DOCUMENTS

| | | | |
|---|---|---|---|
| 6,566,664 B2 * | 5/2003 | Muraki | 250/492.2 |
| 7,109,494 B2 * | 9/2006 | Ono et al. | 250/396 R |
| 8,476,606 B2 * | 7/2013 | Hirata et al. | 250/492.22 |
| 2003/0066974 A1 * | 4/2003 | Muraki | 250/492.2 |
| 2003/0122087 A1 * | 7/2003 | Muraki et al. | 250/492.2 |
| 2004/0169147 A1 * | 9/2004 | Ono et al. | 250/396 R |
| 2012/0015303 A1 * | 1/2012 | Hirata et al. | 430/296 |
| 2012/0115306 A1 * | 5/2012 | Yamazaki et al. | 438/460 |
| 2013/0011796 A1 * | 1/2013 | Hirata | 430/296 |
| 2013/0040240 A1 * | 2/2013 | Terashima | 430/296 |
| 2013/0078577 A1 * | 3/2013 | Yamazaki | 430/296 |

FOREIGN PATENT DOCUMENTS

JP  9-007538 A  1/1997

* cited by examiner

*Primary Examiner* — Bernard E Souw
(74) *Attorney, Agent, or Firm* — Rossi, Kimms & McDowell LLP

(57) ABSTRACT

A drawing apparatus which performs drawing on a substrate with a plurality of charged particle beams includes: a blanking deflector located in a vacuum chamber and configured to blank each of the plurality of charged particle beams; a device located in an external chamber in which a gas pressure is higher than a gas pressure in the vacuum chamber, and configured to control the blanking deflector; and a first substrate facing the blanking deflector. The first substrate constitutes a partition which separates the vacuum chamber and the external chamber in a region, of the first substrate, facing the blanking deflector, and includes an electrode which fills a via formed in the region. The device is electrically connected to the blanking deflector via the electrode.

14 Claims, 15 Drawing Sheets

DRAWING APPARATUS, METHOD OF MANUFACTURING ARTICLE, AND PROCESSING APPARATUS

BACKGROUND OF THE INVENTION

1. Field of the Invention

The present invention relates to a drawing apparatus, a method of manufacturing an article, and a processing apparatus.

2. Description of the Related Art

In recent years, since the characteristics of electronic devices placed in a vacuum apparatus change depending on the temperature, heat generation sources are often located in the exterior of a vacuum chamber, which can be easily cooled. A vacuum apparatus shown in FIG. 12 uses a photodiode 301 located in a vacuum chamber interior 401 to detect a laser beam 222, and uses an amplifier 306 to generate a pulse waveform in proportion to the amount of received light. With an increase in detection frequency, the amplifier 306 generates a larger amount of heat, and the generated heat degrades the detection characteristics of the photodiode 301. Therefore, the amplifier 306 is located in a vacuum chamber exterior 402 via a vacuum feedthrough 304. As the amplifier 306 is located in the vacuum chamber exterior 402, it can be sufficiently cooled by a cooler 209. Also, as the amplifier 306 is spaced apart from the photodiode 301, heat is prevented from being transferred to the photodiode 301. However, with an increase in transmission distance between the photodiode 301 and the amplifier 306, the transmission characteristics degrade. Also, in such a vacuum apparatus which requires a large number of electronic devices, the number of placeable electronic devices is limited due to a constraint in size of components to be mounted, including the vacuum feedthrough 304.

Similarly, a drawing apparatus which draws using a plurality of charged particle beams is often employed as a vacuum apparatus which includes electronic devices that may produce an adverse effect resulting from heat generation, and poses a problem due to factors associated with transmission lines through which signals are transmitted to these electronic devices. FIGS. 14 and 15 illustrate examples of blanking electrodes 208 of a blanking deflector in a conventional drawing apparatus disclosed in Japanese Patent Laid-Open No. 9-7538, drivers which drive the blanking electrodes 208, and transmission lines through which driving signals are transmitted to the blanking electrodes 208. A control circuit 5 of a blanking deflector 16 outputs driving signals to drivers 501. These outputs are connected to interface connectors 202 of a relay substrate (junction substrate) 520 via signal cables 201, and pass through an electron optical system barrel (electron optical system housing; vacuum chamber) 206 in accordance with the wiring pattern. The driving signals having passed through terminators 504 serving as their termination circuits pass through a vacuum seal 510 and are connected to the blanking deflector 16 via contact units 505. A pair of blanking electrodes 208 placed in each blanking aperture 507 is located on the blanking deflector 16, and the driving signals are connected from the contact units 505 to the blanking electrodes 208 via a wiring pattern 506. Also, a coolant is supplied from the cooler 209 to an inlet pipe 514, the relay substrate 520, and an outlet pipe 513 to remove heat generated by the terminator 504, thereby controlling thermal deformation and changes in characteristics of members present inside the electron optical system barrel 206 and the vacuum seal 510.

It is desired to further improve the throughput of such a drawing apparatus. To improve the throughput of the drawing apparatus, it is effective to shorten the interval between repetitions of drawing, that is, the drawing cycle. However, to do this, it is necessary to shorten the blanking time, so the frequency of a control signal for the blanking deflector 16 increases. Again, to improve the throughput of the drawing apparatus, it is also effective to widen the drawing range of one charged particle beam source, that is, the angle of view, so the number of charged particle beams split by an aperture array can be increased. To do this, it is necessary to increase the numbers of electrostatic lenses and blanking deflectors 16 which control the split charged particle beams. This, in turn, makes it necessary to increase the numbers of lenses, electrodes, and eventually wiring lines running to the electrodes.

To shorten the drawing cycle, it is necessary to transmit control signals at high speed. However, maintaining or improving the transmission characteristics to shorten the drawing cycle, and increasing the number of wiring lines to widen the angle of view have a tradeoff relationship. Further, conventionally, signals are transmitted via the wiring pattern of the relay substrate from the exterior of the electron optical system barrel 206 to the electrodes located at nearly the center in the electron optical system barrel 206, and the wiring length has a value (several hundred millimeters) close to the radius of the electron optical system barrel 206. At present, the required frequency components of the driving signals for the blanking electrodes come close to 1 GHz with an apparatus speedup. In such a signal frequency range, the constraints in transmission line capacitance and DC resistance are large. When the transmission line is designed to have a width of, for example, 2 μm, the capacitance of the line other than the capacitances of the blanking electrodes is 1.5 PF, and the DC resistance is 300Ω, the allowable line length calculated from various other conditions is only 15 mm.

To improve the throughput of a drawing apparatus which draws using a plurality of charged particle beams, it is necessary to transmit a large volume of signals at high speed (high frequencies). To do this, it is necessary to widen the wiring region to increase the size of the wiring pattern or shorten the wiring length. First, as a method of widening the wiring region, multilayer wiring is practicable. In this case, a plurality of transmission lines connected from a control signal generation portion using cables via a multilayer wiring device, a multilayer wiring substrate, and a relay substrate are formed by a plurality of electrodes. This method can produce a certain effect, but the number of layers has a limit in terms of manufacture. It is difficult to form high-density wiring and mounting using a currently practicable number of layers (about 50 layers) while maintaining desired transmission characteristics.

On the other hand, to shorten the wiring length on a substrate, a method of shortening the wiring length on a substrate by connecting a cable having an impedance lower than wiring into an electron optical system barrel in a vacuum feedthrough configuration, and locating a photoelectric conversion element or a serial-parallel converter near a blanking electrode array is available. However, because the photoelectric conversion element or serial-parallel converter generates heat near the blanking electrode array, geometric strain may occur in the structure of the blanking electrode array to a degree that cannot be ignored in terms of drawing accuracy. Also, a problem is posed due to factors associated with the mounting volume of the cable in the electron optical system barrel, and a measure against outgassing from the cable and photoelectric conversion element is necessary, leading to increases in apparatus size and cost. The above-mentioned method can shorten the wiring length to improve the transmission characteristics, but poses another problem.

SUMMARY OF THE INVENTION

The present invention provides, for example, a technique advantageous in less heating of a device, in a vacuum chamber, to which a large volume of signals are transmitted at high speed.

The present invention in its one aspect provides a drawing apparatus which performs drawing on a substrate with a plurality of charged particle beams, the apparatus comprising: a blanking deflector located in a vacuum chamber and configured to blank each of the plurality of charged particle beams; a device located in an external chamber in which a gas pressure is higher than a gas pressure in the vacuum chamber, and configured to control the blanking deflector; and a first substrate facing the blanking deflector, wherein the first substrate constitutes a partition which separates the vacuum chamber and the external chamber in a region, of the first substrate, facing the blanking deflector, and includes an electrode which fills a via formed in the region, and the device is electrically connected to the blanking deflector via the electrode.

Further features of the present invention will become apparent from the following description of exemplary embodiments with reference to the attached drawings.

DESCRIPTION OF THE EMBODIMENTS

Figure 1:
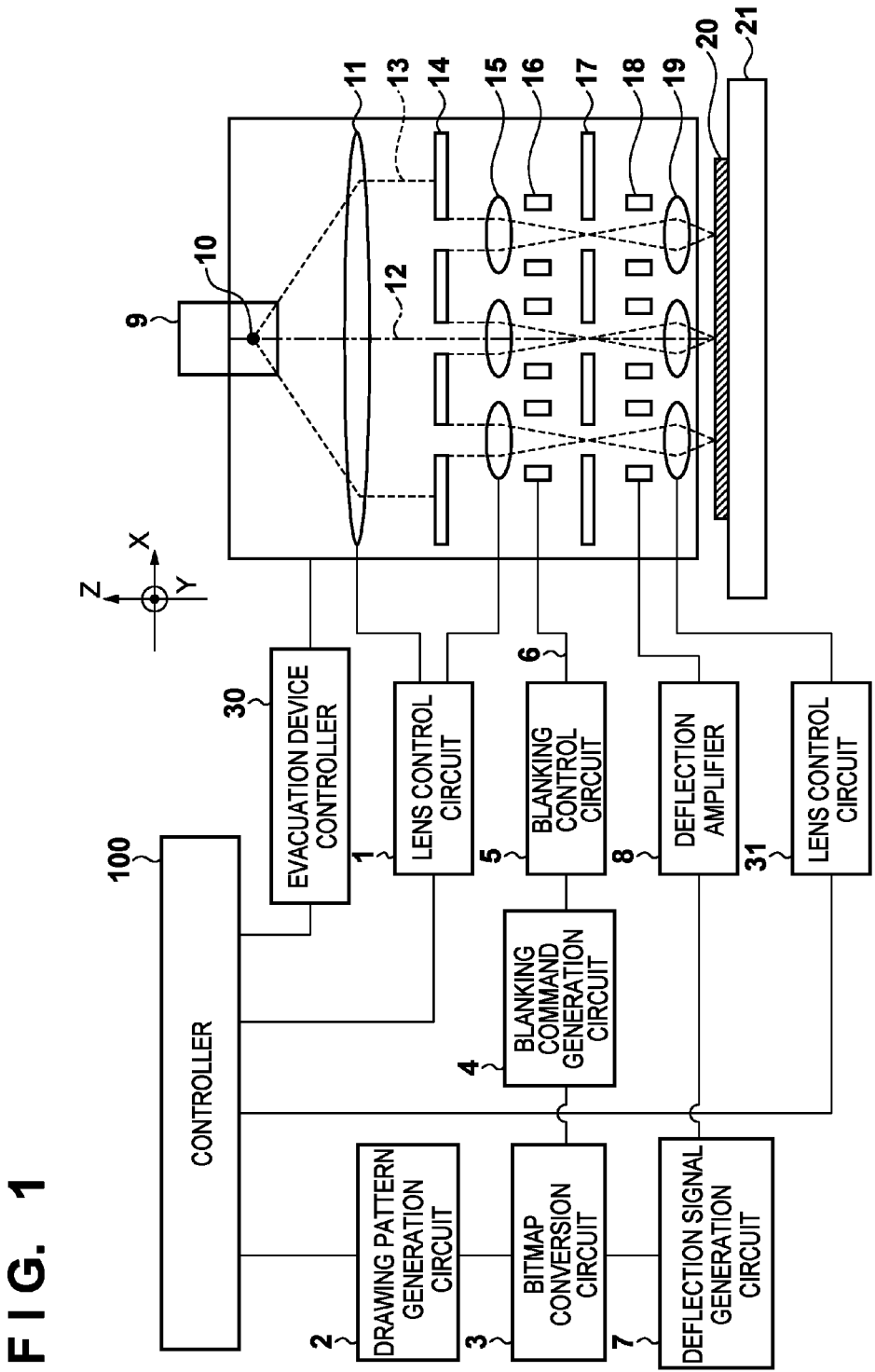
FIG. 1 is a block diagram showing the configuration of a drawing apparatus.

Embodiments of the present invention will be described below with reference to the accompanying drawings. FIG. 1 shows a drawing apparatus which draws a pattern on a substrate while controlling each of a plurality of charged particle beams to an ON state in which the charged particle beam strikes the substrate, or an OFF state in which the charged particle beam does not strike the substrate. This embodiment shows the configuration of a drawing apparatus which draws a pattern using a plurality of electron beams as an example of the above-mentioned drawing apparatus. An electron gun 9 forms a crossover 10. Reference numerals 12 and 13 denote the trajectories of electrons diverging from the crossover 10. The electrons diverging from the crossover 10 are converted into a collimated beam by the action of a collimator lens 11 formed by an electromagnetic lens, and enter an aperture array 14. The aperture array 14 includes a plurality of circular apertures arrayed in a matrix, and splits the incident electron beam into a plurality of electron beams. The electron beams having passed through the aperture array 14 enter an electrostatic lens 15 formed by three electrode plates (these three electrode plates are shown as an integrated electrode plate in FIG. 1) including circular apertures.

A blanking aperture 17 formed by arranging apertures in a matrix is located at the position at which the electrostatic lens 15 forms crossovers for the first time. A blanking deflector 16 formed by arranging electrodes in a matrix controls each of the plurality of electron beams to an ON state in which the electron beam strikes the substrate, or an OFF state (blanking state) in which the electron beam does not strike the substrate. In the blanking state, the electron beams deflected by the blanking deflector 16 are blocked by the blanking aperture 17. The blanking deflector 16 is controlled in accordance with a blanking signal generated by a drawing pattern generation circuit 2, a bitmap conversion circuit 3, and a blanking command generation circuit 4. The electron beam which is controlled to the ON state by the blanking deflector 16 and passes through the blanking aperture 17 forms an image by a second electrostatic lens 19 to, in turn, form an image of the original crossover on a substrate 20 such as a wafer or a mask. During drawing, the substrate 20 continuously moves in the X-direction by a stage 21, and an image on the surface of the substrate 20 is deflected in the Y-direction by a deflector 18 with reference to the length measurement result obtained by a laser length measurement device and is blanked by the blanking deflector 16. Also, an evacuation device (vacuum pumping device) controller 30 controls an evacuation device (to be described later).

First Embodiment

Figure 2:
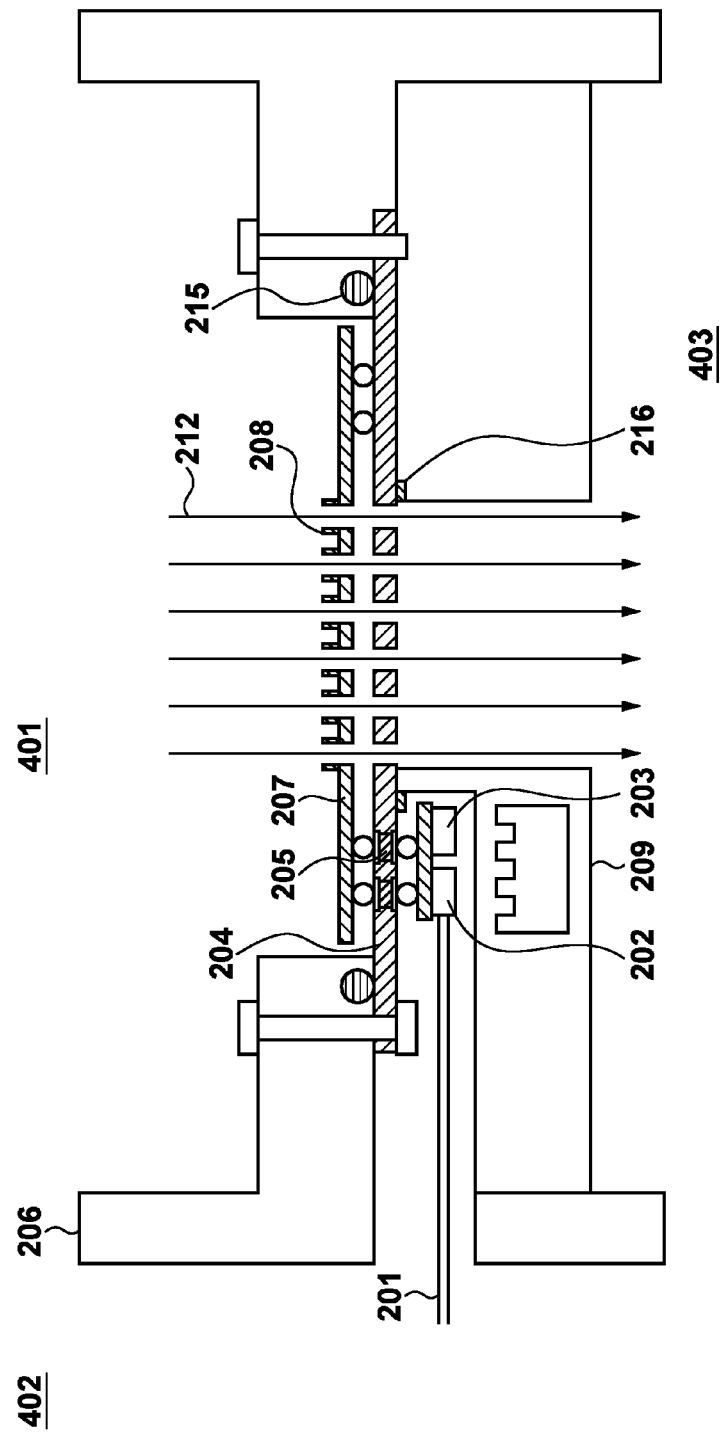
FIG. 2 is a view showing the configuration of a blanking deflector according to the first embodiment.

FIG. 2 shows the configuration of a blanking deflector 16 according to the first embodiment in the drawing apparatus, and a transmission line through which a signal for driving blanking electrodes 208 is transmitted. A blanking command value is connected to an interface connector 202 of the blanking deflector 16 via a signal cable 201. Note that a blanking command value is transmitted by high-speed serial communication in accordance with an optical signal using an optical fiber as the signal cable 201 for transmission. The interface connector 202 serves as a photoelectric conversion element. The interface connector 202 converts the optical signal into an electrical signal, and a serial-parallel converter 203 generates a driving signal for driving each blanking electrode 208. The driving signal is connected to a blanking electrode array 207 in an electron optical system barrel 206 via electrodes 205 filling vias (via holes or through holes) in a silicon substrate 204. On the blanking electrode array 207, the driving signal is connected to the blanking electrodes 208 via multilayer wiring (not shown), so a voltage is applied to the blanking electrodes 208 in accordance with the driving signal. The interface connector 202 and serial-parallel converter 203 are elements or electronic components (to be also referred to as devices hereinafter) constituting a control circuit 5 of the blanking deflector 16.

The silicon substrate (first substrate) 204 is used as parts of partitions (partition walls) which separate a vacuum chamber (decompression chamber; first vacuum chamber) 401 in which the blanking deflector 16 is located, a vacuum chamber (second vacuum chamber) 403 in which a second electrostatic lens 19 is located, and an external chamber 402 outside the electron optical system barrel 206. Note that the degree of vacuum (degree of decompression) in the external chamber 402 may be lower than those in the first vacuum chamber 401 and second vacuum chamber 403, and may be normal pressure (atmospheric pressure). Also, the degrees of vacuum in the first vacuum chamber 401 and second vacuum chamber 403 may be equal to or different from each other. The interface connector 202 and serial-parallel converter 203 which serve as elements constituting the control circuit 5 of the blanking deflector 16 and generate large amounts of heat are located in the external chamber 402. The silicon substrate 204 includes a first region forming the partition which separates the first vacuum chamber 401 and the external chamber 402. Note that the silicon substrate 204 may include a second region forming the partition which separates the first vacuum chamber 401 and the second vacuum chamber 403. In this case, the second region includes vias through which the electron beams pass. The first region on the silicon substrate 204 includes the electrodes 205. The electrodes 205 fill vias formed in the first region on the silicon substrate 204 to align themselves across the distance from the first vacuum chamber 401 to the external chamber 402. The interface connector 202 and serial-parallel converter 203 located in the external chamber 402 are electrically connected via the electrodes 205 to the blanking electrodes 208 located in the first vacuum chamber 401 within the electron optical system barrel 206. This makes it possible to considerably shorten the wiring length from the interface connector 202 and serial-parallel converter 203 to the blanking electrodes 208, thereby greatly improving the transmission characteristics of the signal transmission line. Also, the diameter of each coaxial connector used in a vacuum feedthrough and the interval between the connectors are normally on the order of several to several ten millimeters, while the diameter of each via filled with the electrode 205 in the silicon substrate 204 and the interval between the vias are as small as on the order of several ten to several hundred micrometers. This makes it possible to extend a large amount of wiring from the exterior of the electron optical system barrel 206 at a smaller mounting area. Further, the interface connector 202 and serial-parallel converter 203 are located outside the electron optical system barrel 206. With this arrangement, the thermal contact resistances of the interface connector 202 and serial-parallel converter 203 decrease. This makes it possible to sufficiently cool the interface connector 202 and serial-parallel converter 203 using a cooler 209, thereby preventing heat from being transmitted to the blanking electrode array 207.

Second Embodiment

Figure 3:
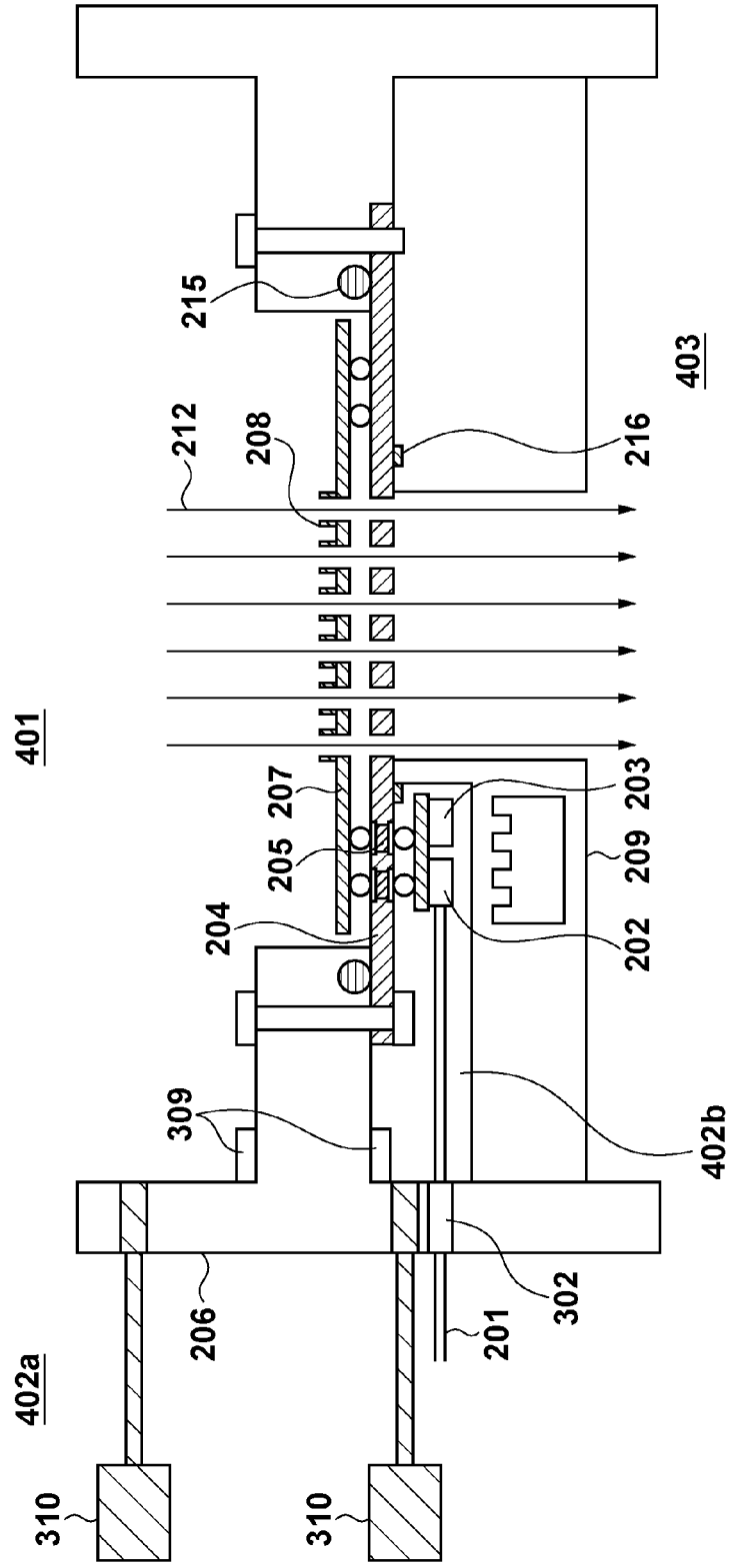
FIG. 3 is a view showing the configuration of a blanking deflector according to the second embodiment.

FIG. 3 shows the configuration of a blanking deflector 16 according to the second embodiment, and a transmission line through which a signal for driving blanking electrodes 208 is transmitted. Since a first vacuum chamber 401 in an electron optical system barrel 206 has a high degree of vacuum, excessive stress deformation may occur in a silicon substrate 204 serving as a partition if the pressure difference between the first vacuum chamber 401 and an anterior chamber 402a as part of an external chamber 402 outside the electron optical system barrel 206 is large. To combat this problem, the external chamber 402 is divided into the anterior chamber 402a and an intermediate chamber 402b so that the intermediate chamber 402b is placed between the first vacuum chamber 401 and the anterior chamber 402a. The intermediate chamber 402b is decompressed to the intermediate pressure between the pressure in the first vacuum chamber 401 and that in the anterior chamber 402a by differential pumping (differential evacuation) to change the pressure difference stepwise, thereby suppressing stress deformation of the silicon substrate 204. A vacuum feedthrough (connector) 302 is formed on a partition which separates the anterior chamber 402a and the intermediate chamber 402b to connect a cable 201 to an interface connector 202 and a serial-parallel converter 203, as shown in FIG. 3. The silicon substrate (first substrate) 204 including electrodes 205 filling vias formed in it is used as a partition to isolate the first vacuum chamber 401 which has a high degree of vacuum and through which electron beams 212 pass in the electron optical system barrel 206. The interface connector 202, the serial-parallel converter 203, and a blanking electrode array 207 are electrically connected to each other via the electrodes 205 filling the vias in the silicon substrate 204.

In this manner, the intermediate chamber 402b is formed using the silicon substrate 204 as a partition to isolate the first vacuum chamber 401 which has a high degree of vacuum and through which the electron beams 212 pass in the electron optical system barrel 206. The pressure difference between the first vacuum chamber 401 and the intermediate chamber 402b is measured by a pressure sensor 309, and the pressure in the intermediate chamber 402b is adjusted by an evacuation device 310 to the degree that stress deformation of the silicon substrate 204 poses no problem. The pressure adjustment is done in accordance with the area and thickness of the silicon substrate 204 so that the thermal contact resistance minimizes at the pressure difference at which stress deformation of the silicon substrate 204 poses no problem. As described above, the intermediate chamber 402b is formed using the silicon substrate 204 as a partition to isolate the first vacuum chamber 401 through which the electron beams 212 pass, and the pressure in the intermediate chamber 402b is adjusted by differential pumping, thereby suppressing stress deformation of the silicon substrate 204.

Third Embodiment

Figure 4:
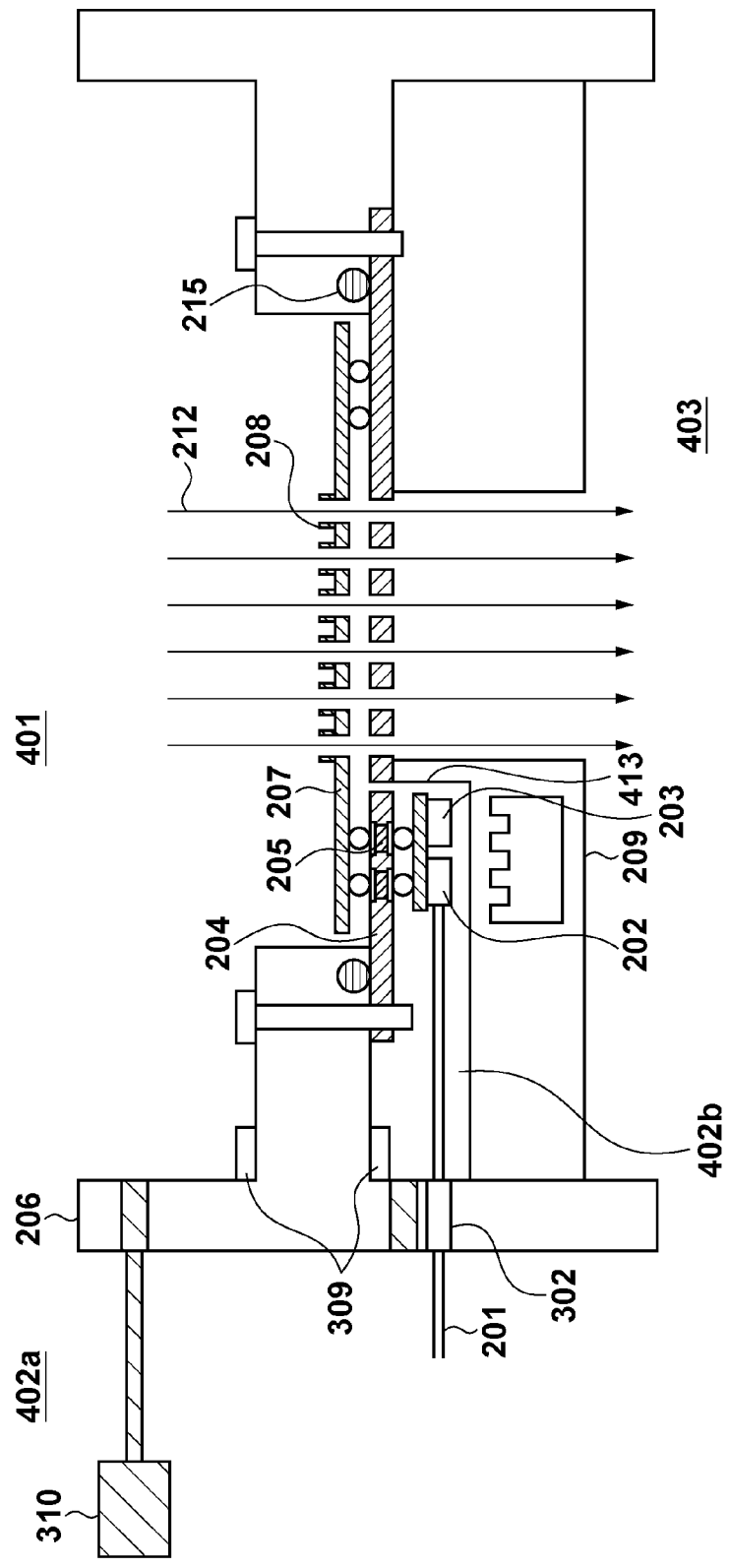
FIG. 4 is a view showing the configuration of a blanking deflector according to the third embodiment.

FIG. 4 shows the configuration of a blanking deflector 16 according to the third embodiment, and a transmission line through which a signal for driving blanking electrodes 208 is transmitted. The third embodiment copes with stress deformation of a silicon substrate due to the pressure difference, like the second embodiment. An intermediate chamber 402b is placed between a first vacuum chamber 401 and an anterior chamber 402a, as shown in FIG. 4. A silicon substrate 204 is used as a partition to isolate the first vacuum chamber 401 which has a high degree of vacuum and through which electron beams 212 pass in an electron optical system barrel 206. An interface connector 202, serial-parallel converter 203, and blanking electrode array 207 located in the intermediate chamber 402b are connected to each other via electrodes 205 filling vias in the silicon substrate 204. Not only the electrodes 205 but also an orifice (via) 413 is formed in the silicon substrate 204. The pressure difference between the first vacuum chamber 401 and the intermediate chamber 402b is measured by a pressure sensor 309, and adjusted by an evacuation device 310 to the degree that stress deformation of the silicon substrate 204 poses no problem. The pressure adjustment is done in accordance with the area and thickness of the silicon substrate 204 so that the thermal contact resistance minimizes at the pressure difference at which stress deformation of the silicon substrate 204 poses no problem, thereby maintaining the gas pressure in the intermediate chamber 402b higher than that in the first vacuum chamber 401. As described above, the intermediate chamber 402b is formed using the silicon substrate 204 as a partition to isolate the first vacuum chamber 401 through which the electron beams 212 pass, and the pressure difference between the first vacuum chamber 401 and the intermediate chamber 402b is adjusted by differential pumping, thereby suppressing stress deformation of the silicon substrate 204. Unlike the second embodiment, the evacuation device 310 which evacuates both the intermediate chamber 402b and first vacuum chamber 401 is commonly used to keep the cost low.

Fourth Embodiment

Figure 5:
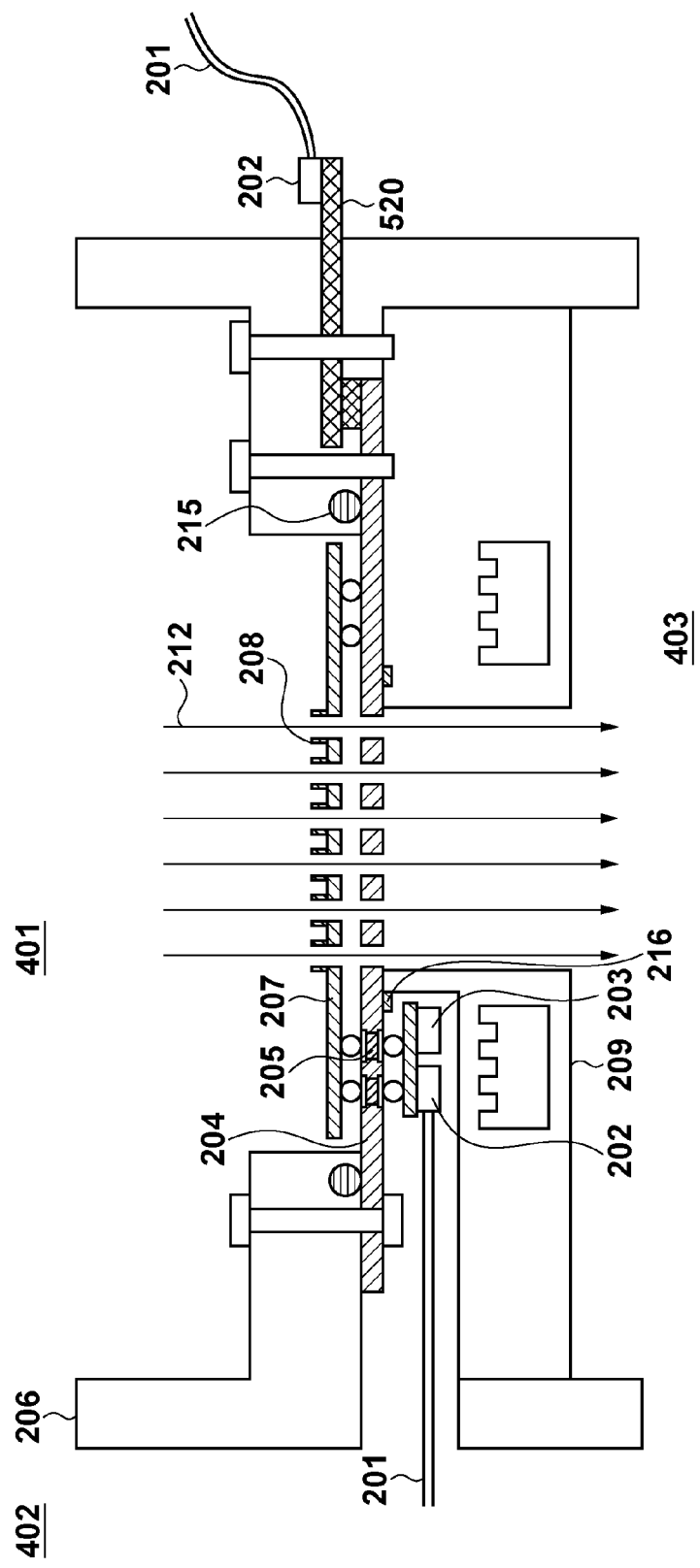
FIG. 5 is a view showing the configuration of a blanking deflector according to the fourth embodiment.
Figure 6:
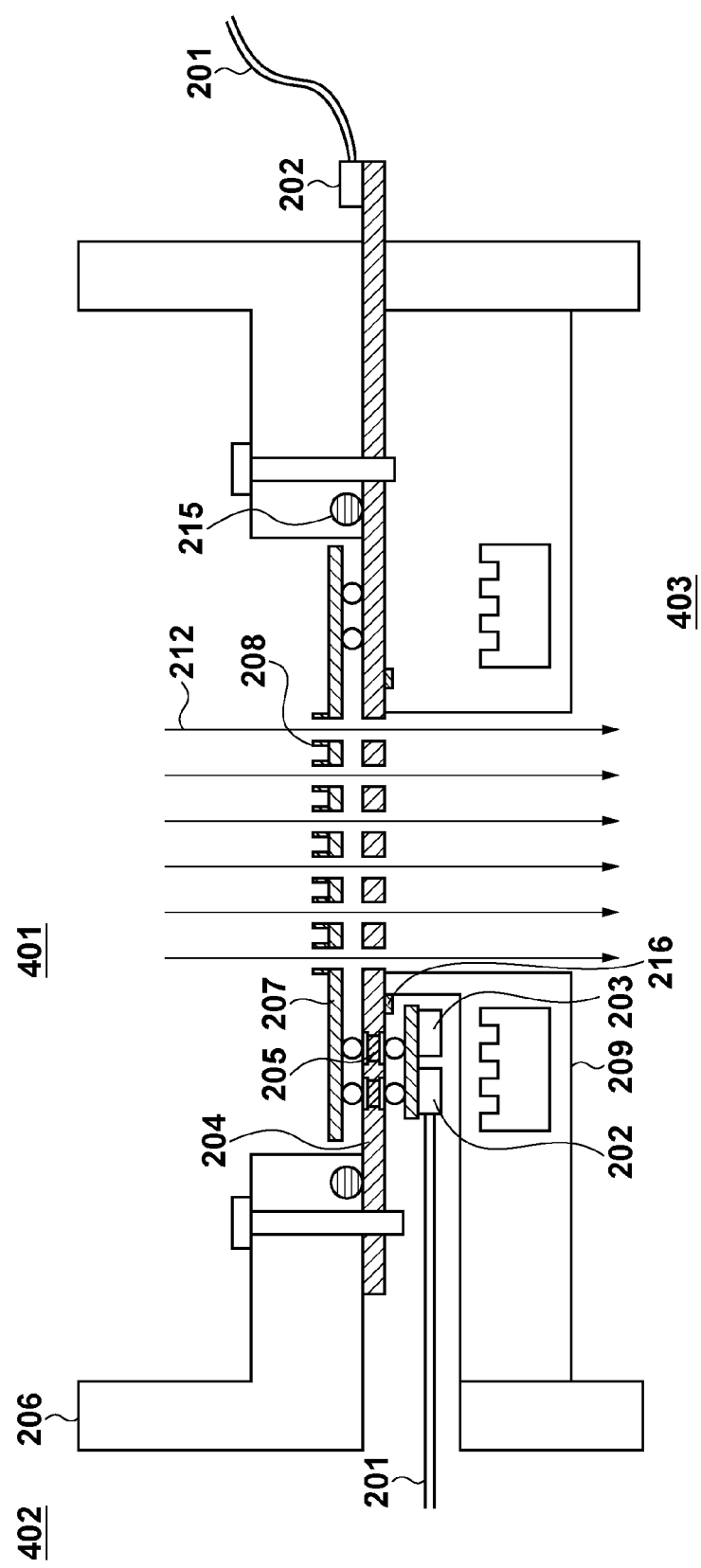
FIG. 6 is a view showing another configuration of the blanking deflector according to the fourth embodiment.

FIG. 5 shows the configuration of a blanking deflector 16 according to the fourth embodiment, and a transmission line through which a signal for driving blanking electrodes 208 is transmitted. In addition to the configuration according to the first embodiment, as in the related art, a transmission line (second transmission line) is formed in an electron optical system barrel 206 via a relay substrate 520, as shown in FIG. 5. A signal which needs to be transmitted at high speed, such as a driving signal for the blanking electrodes 208, is transmitted through a transmission line (first transmission line) via electrodes 205 in a silicon substrate 204. The amount of transmission (transmission line capacitance) of the second transmission line per unit time is smaller (lower) than that of the first transmission line. Signals which need not be transmitted at high speed, such as signals for power supply and initial settings and an asynchronous signal, are transmitted through the transmission line via the relay substrate 520. By forming different transmission lines in accordance with the signal speed, a large number of transmission lines can be used. Also, although the relay substrate 520 is used in this embodiment, the same effect can be obtained by connecting the silicon substrate 204 to other transmission lines formed in the electron optical system barrel 206, as shown in FIG. 6.

Fifth Embodiment

Figure 7:
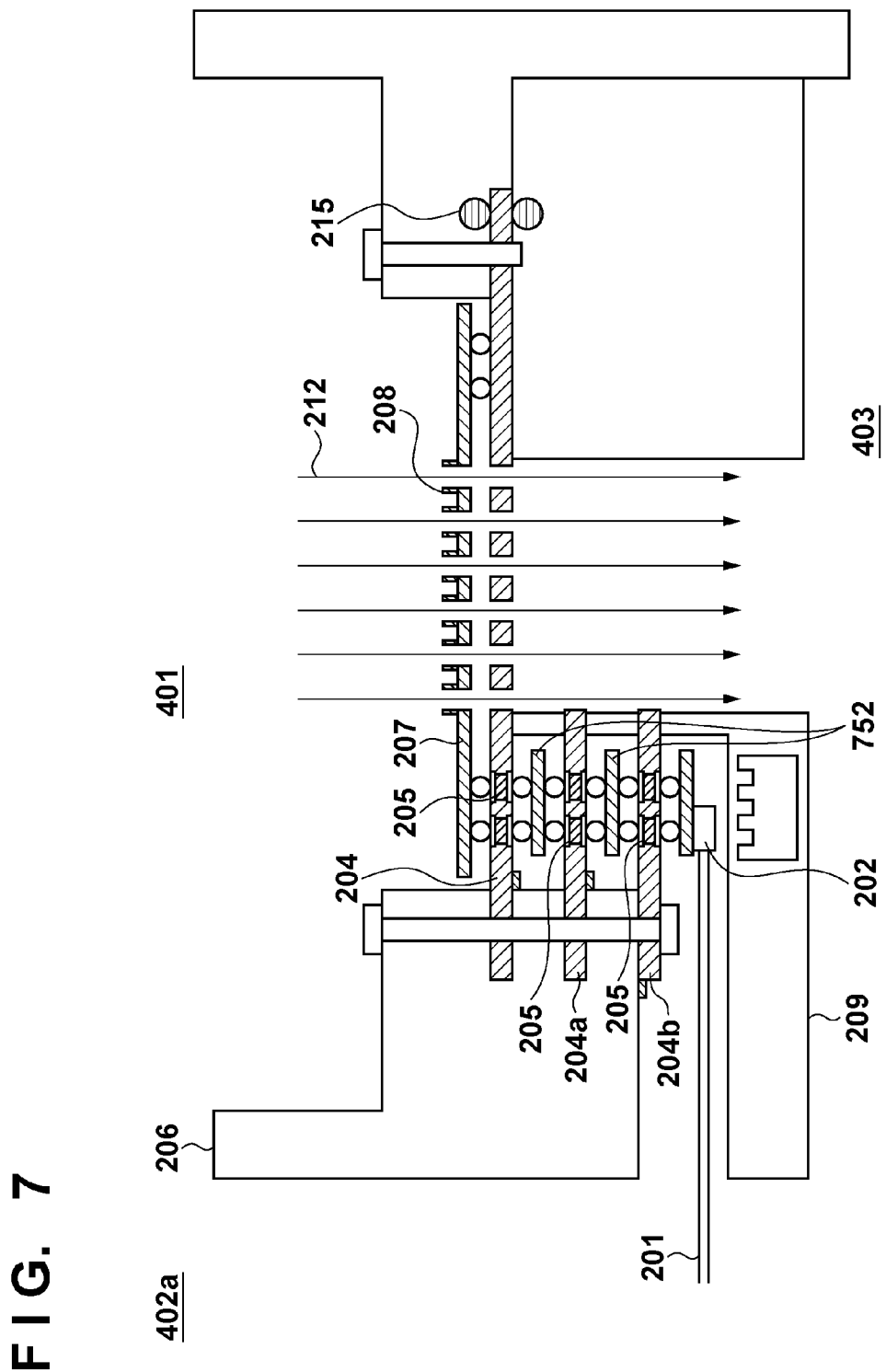
FIG. 7 is a view showing the configuration of a blanking deflector according to the fifth embodiment.

FIG. 7 shows the configuration of a blanking deflector 16 according to the fifth embodiment, and a transmission line through which a signal for driving blanking electrodes 208 is transmitted. In this embodiment, a plurality of intermediate chambers 402b are placed between a first vacuum chamber 401 in which the blanking deflector 16 is placed, and an anterior chamber 402a in which an interface connector 202 is located. Among the plurality of intermediate chambers 402b, the intermediate chamber positioned on the side of the first vacuum chamber 401 serves as a second intermediate chamber which is located between the intermediate chamber and the first vacuum chamber and in which a device is located. The first vacuum chamber 401 and the intermediate chamber 402b connected to it are separated by a first silicon substrate 204 including electrodes 205. The anterior chamber 402a and the intermediate chamber 402b connected to it are separated by a second silicon substrate (second substrate) 204b including electrodes 205. The two intermediate chambers 402b are separated by a third silicon substrate (third substrate) 204a including electrodes 205. Electronic components 752 are located in the two intermediate chambers 402b. Examples of the electronic components 752 include a serial-parallel converter, an element which generates a driving signal, and a memory which stores correction information for the driving signal.

A blanking command value is connected to the interface connector 202 via a signal cable 201. The blanking command value is connected from the interface connector 202 to a blanking electrode array 207, located in the first vacuum chamber 401, via the electrodes 205 in the silicon substrates 204, 204a, and 204b and the electronic components 752 located in the two intermediate chambers 402b. The electronic components 752 are connected to each other via the electrodes 205, so signals can be processed at high speed. Therefore, a process which is normally performed in a driver substrate (not shown) mounted outside an electron optical system barrel 206 can be performed in the intermediate chamber 402b within the electron optical system barrel 206, thereby reducing the number of components mounted outside the electron optical system barrel 206. Also, the interface connector 202 is located in the anterior chamber 402a which is outside the electron optical system barrel 206 and farthest from the first vacuum chamber 401. With this arrangement, the thermal contact resistance of the interface connector 202 decreases. This makes it possible to sufficiently cool the interface connector 202 using a cooler 209, thereby preventing heat from being transmitted to the blanking electrode array 207.

Sixth Embodiment

Figure 8:
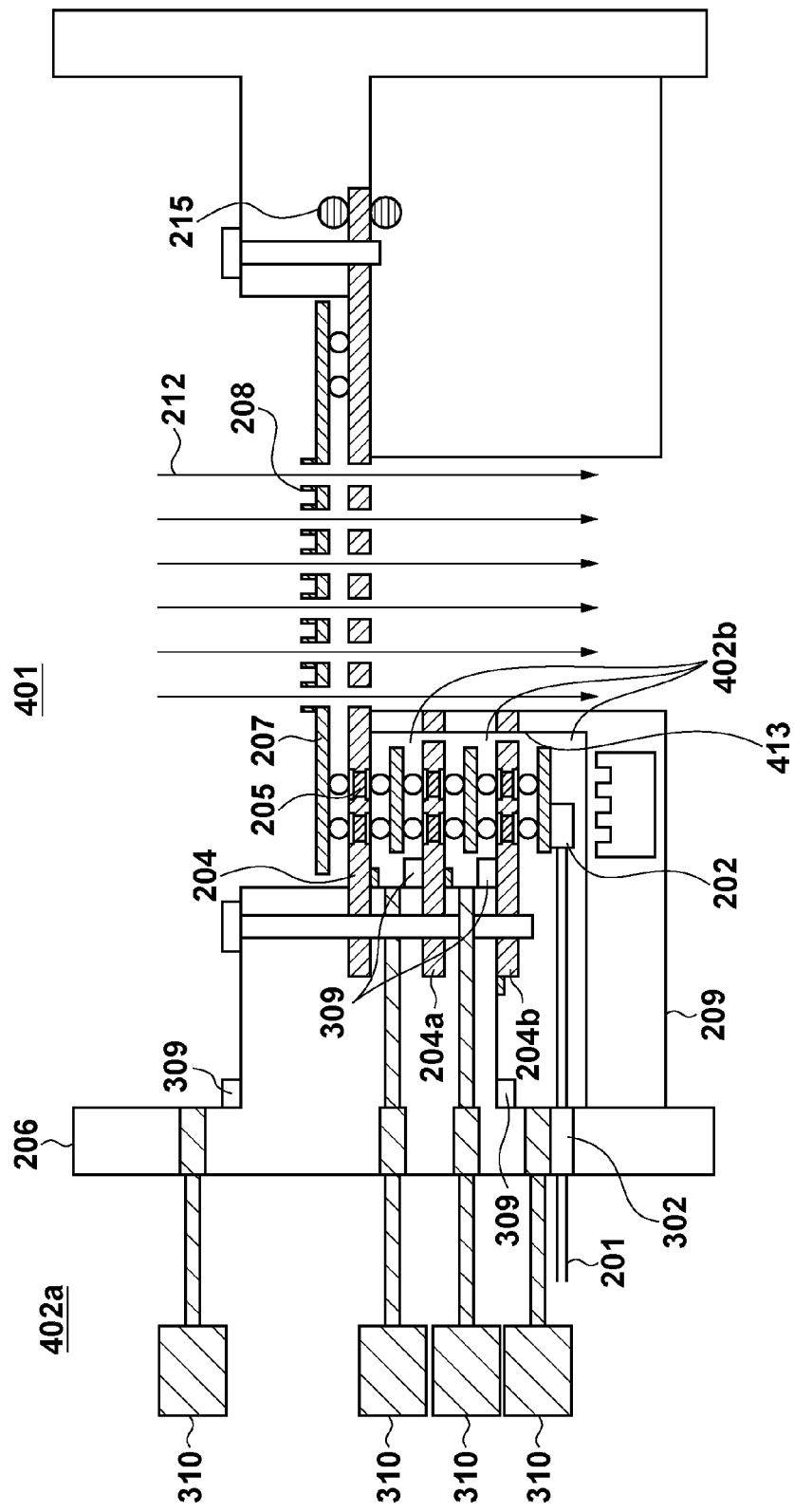
FIG. 8 is a view showing the configuration of a blanking deflector according to the sixth embodiment.

FIG. 8 shows the configuration of a blanking deflector 16 according to the sixth embodiment, and a transmission line through which a signal for driving blanking electrodes 208 is transmitted. Since the interior of an electron optical system barrel 206 has a high degree of vacuum, excessive stress deformation may occur in silicon substrates 204 and 204b if the pressure difference between the interior and exterior of the electron optical system barrel 206 is large. To combat this problem, the pressure differences among a first vacuum chamber 401, a plurality of intermediate chambers 402b, and an anterior chamber 402a are adjusted to suppress stress deformation of the silicon substrates 204 and 204b. A cable 201 or a connector 302 is placed in the electron optical system barrel 206 and connected into it in a vacuum feedthrough configuration, thereby connecting, for example, the cable 201 or the vacuum feedthrough (connector) 302 on a flexible substrate to an interface connector 202. As in the fifth embodiment, a junction of electronic components 752 is repeated via electrodes 205 in the silicon substrates 204 and 204b, so a blanking command value is finally connected to a blanking electrode array 207 located in the first vacuum chamber 401.

Pressure sensors 309 and evacuation devices 310 are placed in the first vacuum chamber 401 and each intermediate chamber 402b separated by the silicon substrates 204 and 204b, and the pressure difference between the first vacuum chamber 401 and each intermediate chamber 402b is measured by the corresponding one of the plurality of pressure sensors 309. An evacuation device controller 30 controls the evacuation devices based on the detection results obtained by the plurality of pressure sensors 309, respectively, so that the amounts of stress deformation of the silicon substrates 204 and 204b fall within a tolerance. The pressures in the first vacuum chamber 401 and each intermediate chamber 402b are adjusted in accordance with the areas and thicknesses of the silicon substrates 204 and 204b so that the thermal contact resistance minimizes at the pressure difference at which stress deformation of the silicon substrates 204 and 204b poses no problem. As described above, the pressures in the first vacuum chamber 401 and each intermediate chamber 402b separated by the silicon substrates 204 and 204b are adjusted, thereby suppressing stress deformation of the silicon substrates 204 and 204b. The sixth embodiment provides an example in which the pressure increases in the order of the first vacuum chamber 401 having a highest degree of vacuum to the anterior chamber 402a as:

(Pressure in Anterior Chamber 402a>Pressure in Intermediate Chamber 402b>Pressure in First Vacuum Chamber 401)

Seventh Embodiment

Figure 9:
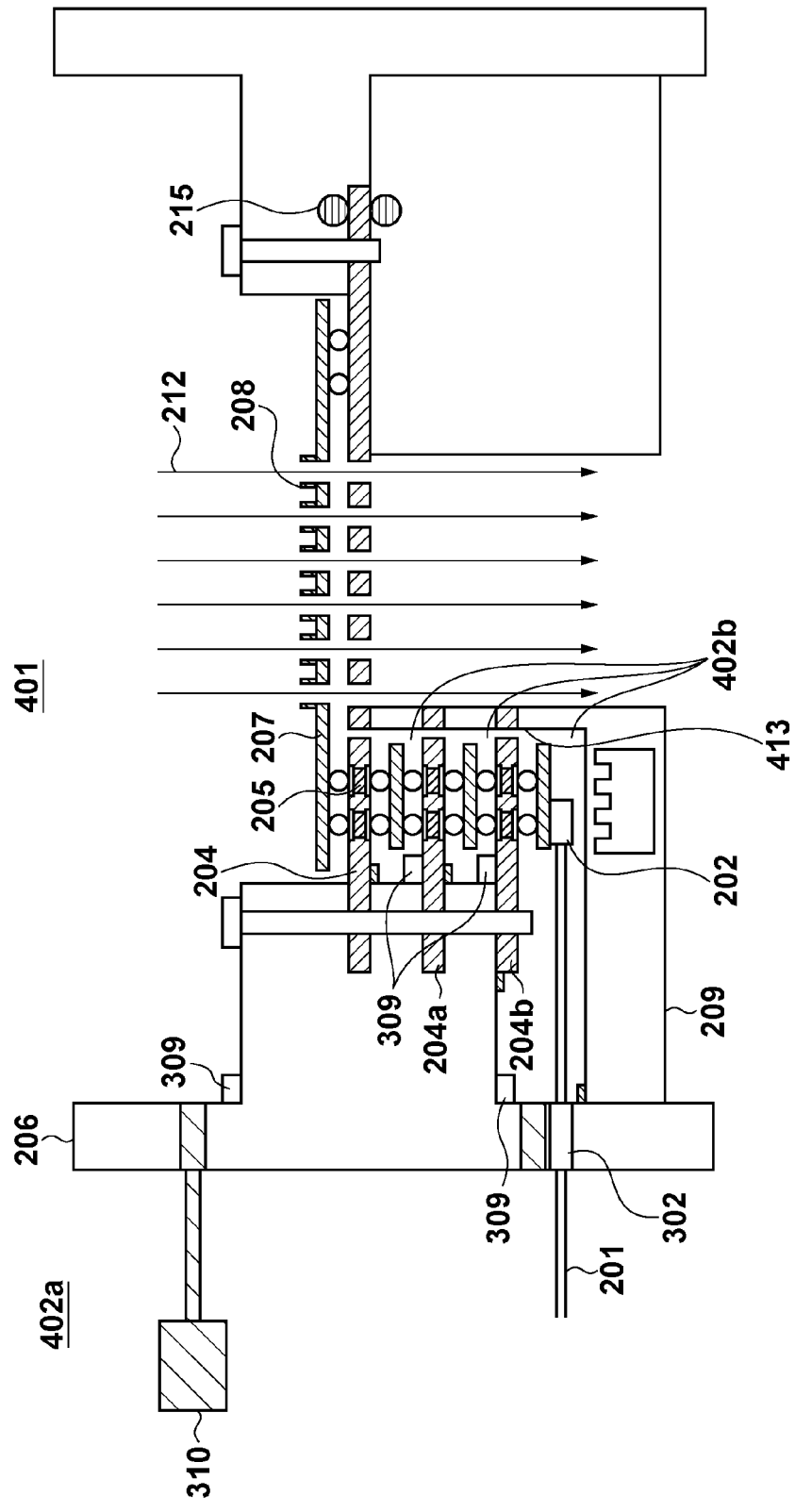
FIG. 9 is a view showing the configuration of a blanking deflector according to the seventh embodiment.

FIG. 9 shows the configuration of a blanking deflector 16 according to the seventh embodiment, and a transmission line through which a signal for driving blanking electrodes 208 is transmitted. The seventh embodiment copes with stress deformation of silicon substrates 204 and 204b due to the pressure differences, like the sixth embodiment. Not only electrodes 205 but also an orifice (via) 413 is formed in the silicon substrates 204 and 204b, as shown in FIG. 9. Also, in the seventh embodiment, the pressure difference between a first vacuum chamber 401 and each intermediate chamber 402b is measured by one pressure sensor 309, and adjusted by an evacuation device 310 so stress deformation of the silicon substrates 204 and 204b poses no problem. The pressure adjustment is done in accordance with the areas and thicknesses of the silicon substrates 204 and 204b so that the thermal contact resistance minimizes at the pressure difference at which stress deformation of the silicon substrates 204 and 204b poses no problem. In the seventh embodiment, the evacuation device 310 is commonly used to keep the cost low.

Eighth Embodiment

Figure 10:
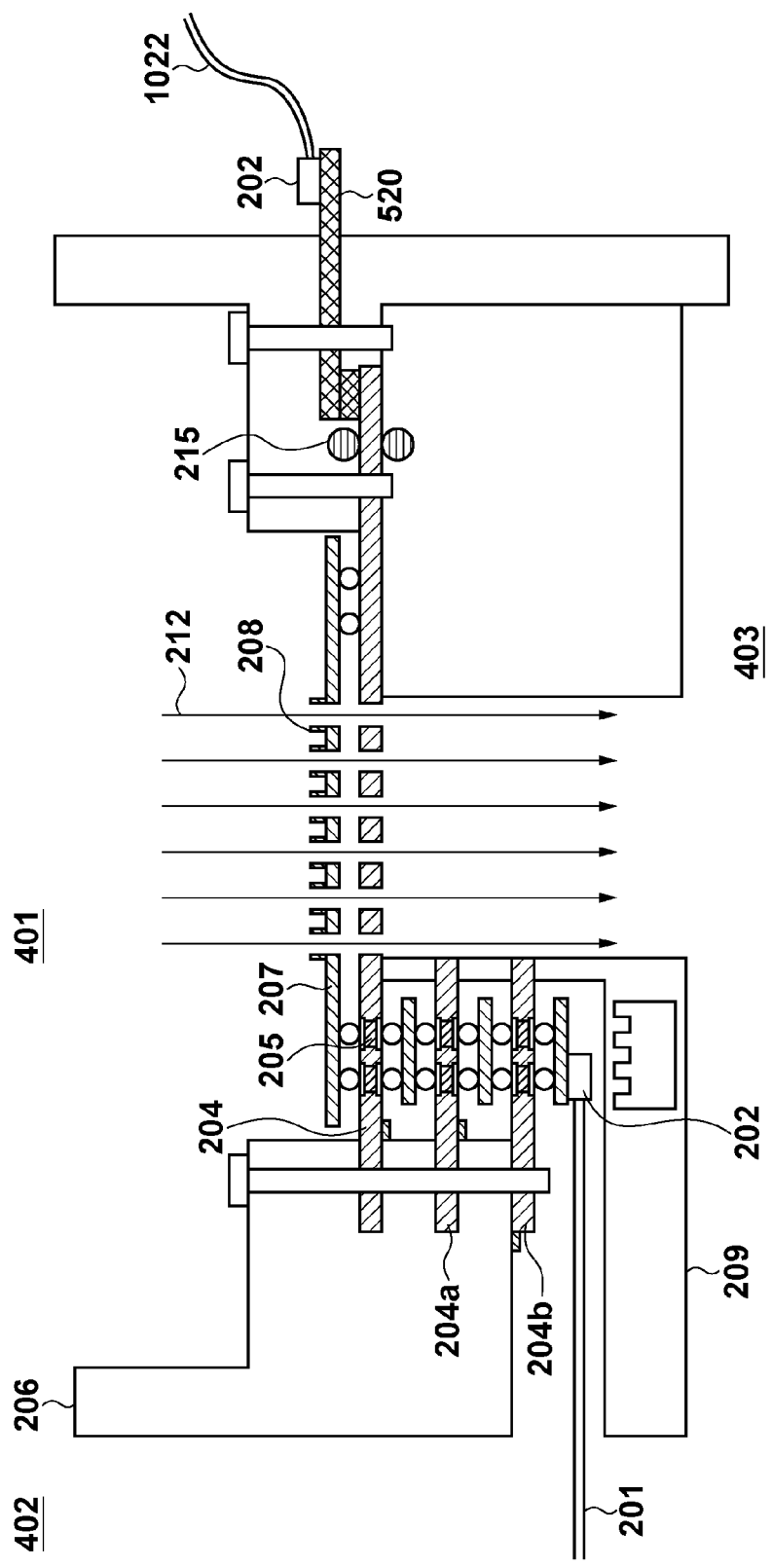
FIG. 10 is a view showing the configuration of a blanking deflector according to the eighth embodiment.
Figure 11:
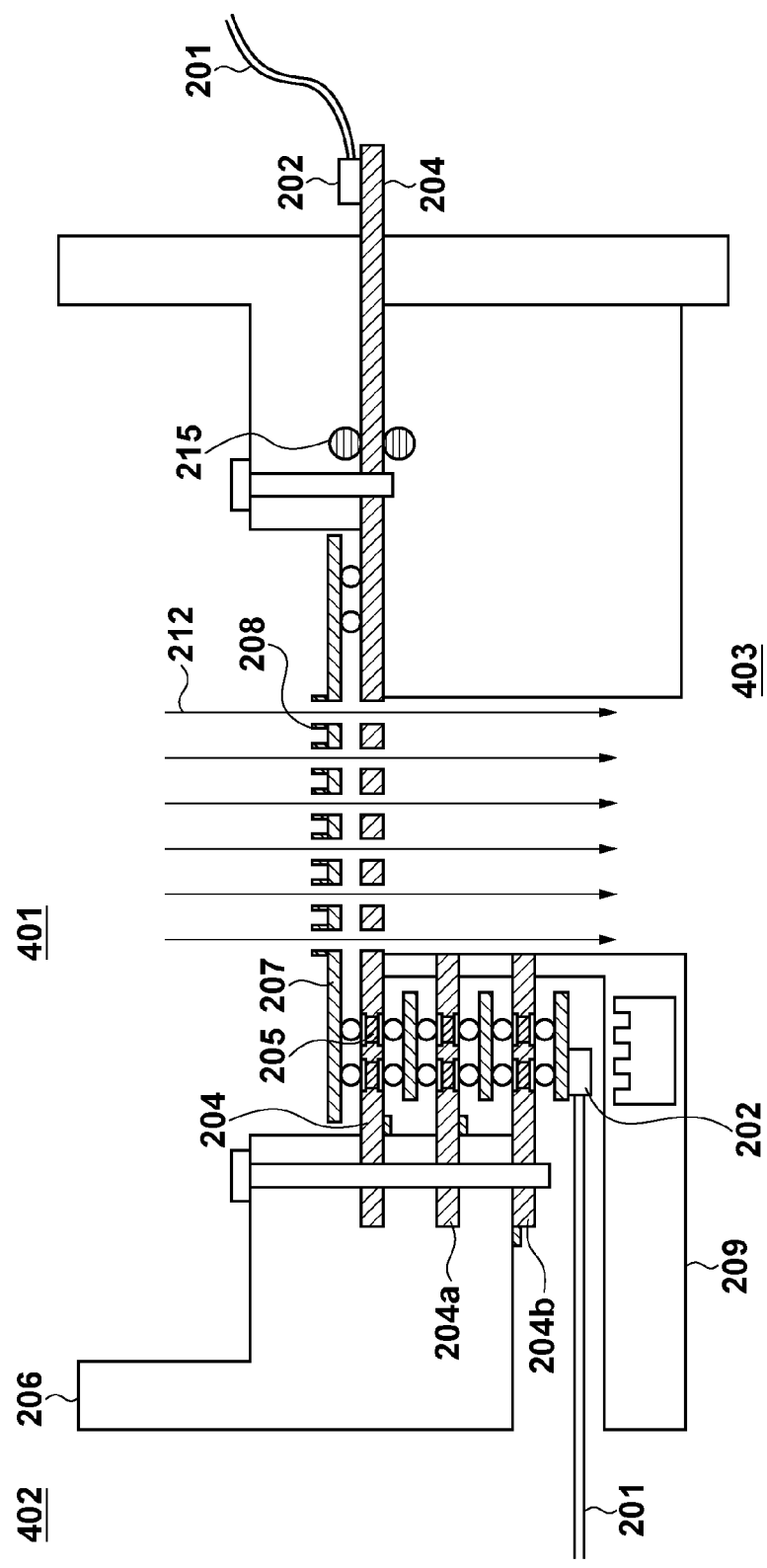
FIG. 11 is a view showing another configuration of the blanking deflector according to the eighth embodiment.
Figure 12:
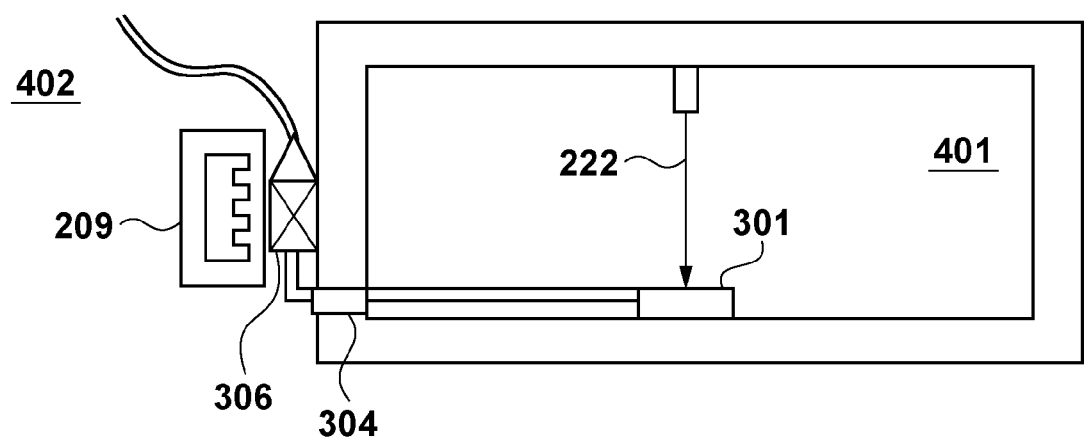
FIG. 12 is a view showing the configuration of the conventional vacuum apparatus.

FIG. 10 shows the configuration of a blanking deflector 16 according to the eighth embodiment, and a transmission line through which a signal for driving blanking electrodes 208 is transmitted. In addition to the configuration according to the fifth embodiment, a second transmission line is independently formed in a first vacuum chamber 401 within an electron optical system barrel 206 via a relay substrate 520, as shown in FIG. 10. A signal which needs to be transmitted at high speed, such as a driving signal for the blanking electrodes 208, is transmitted through a first transmission line via electrodes 205 in a silicon substrate 204. Signals which need not be transmitted at high speed, such as signals for power supply and initial settings and an asynchronous signal, are transmitted through the second transmission line via the relay substrate 520. In this manner, by forming a plurality of transmission lines having different amounts of transmission per unit time in accordance with the signal speed, a large number of transmission lines can be used. Also, although the relay substrate 520 is used in the eighth embodiment, the same effect can be obtained by connecting the silicon substrate 204 to the second transmission line, as shown in FIG. 11.

Ninth Embodiment

Figure 13:
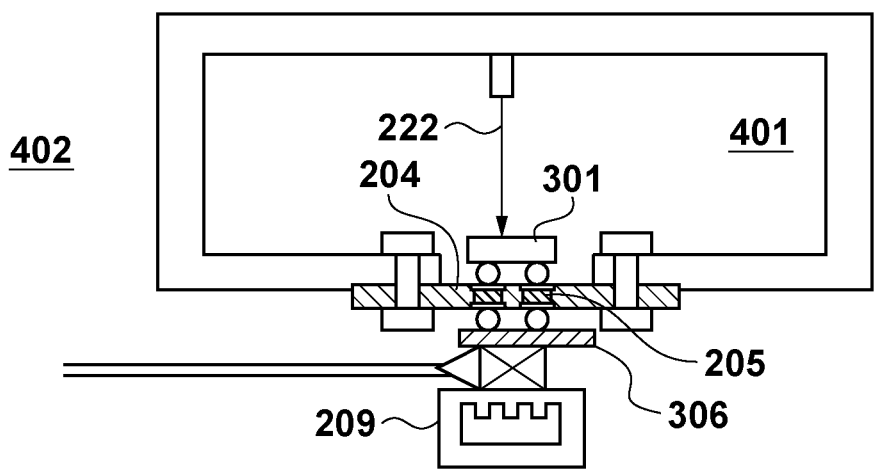
FIG. 13 is a view showing the configuration of a vacuum apparatus according to the ninth embodiment.
Figure 14:
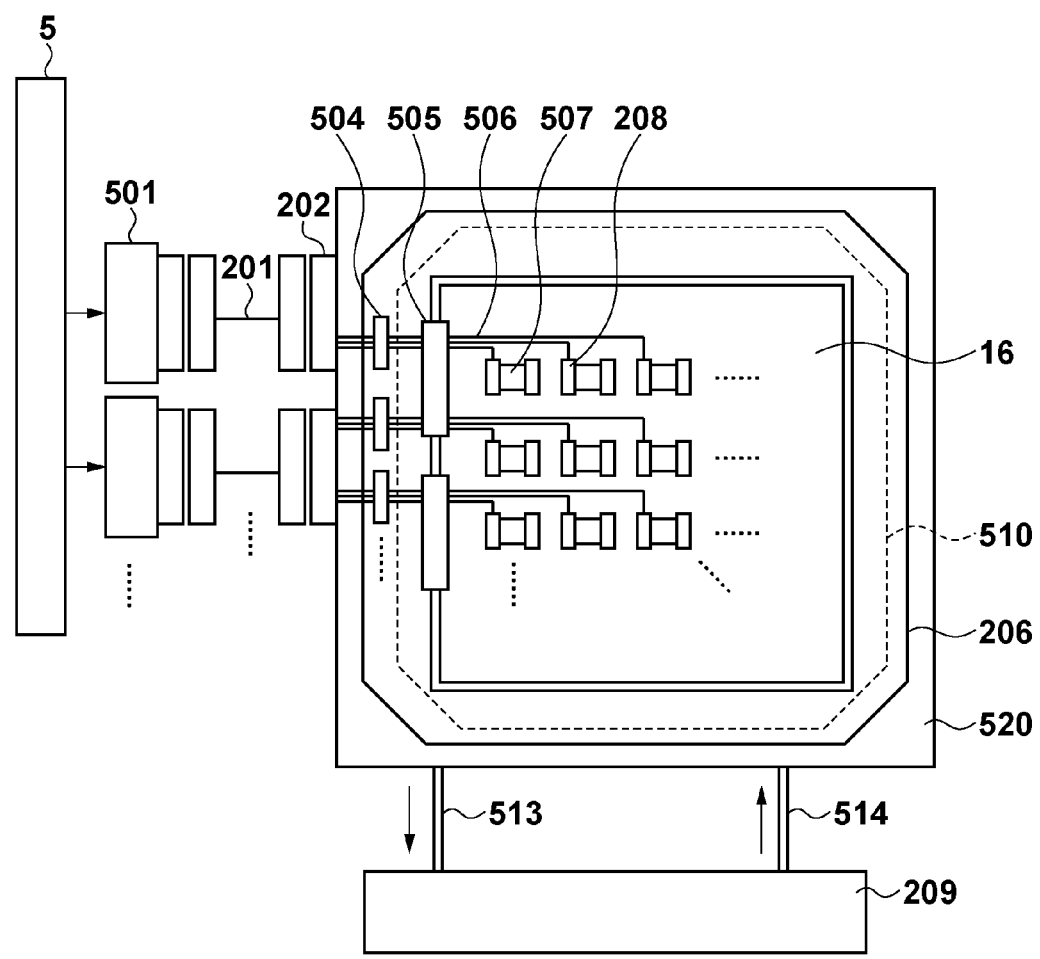
FIG. 14 is a view showing the configuration of the conventional blanking deflector.
Figure 15:
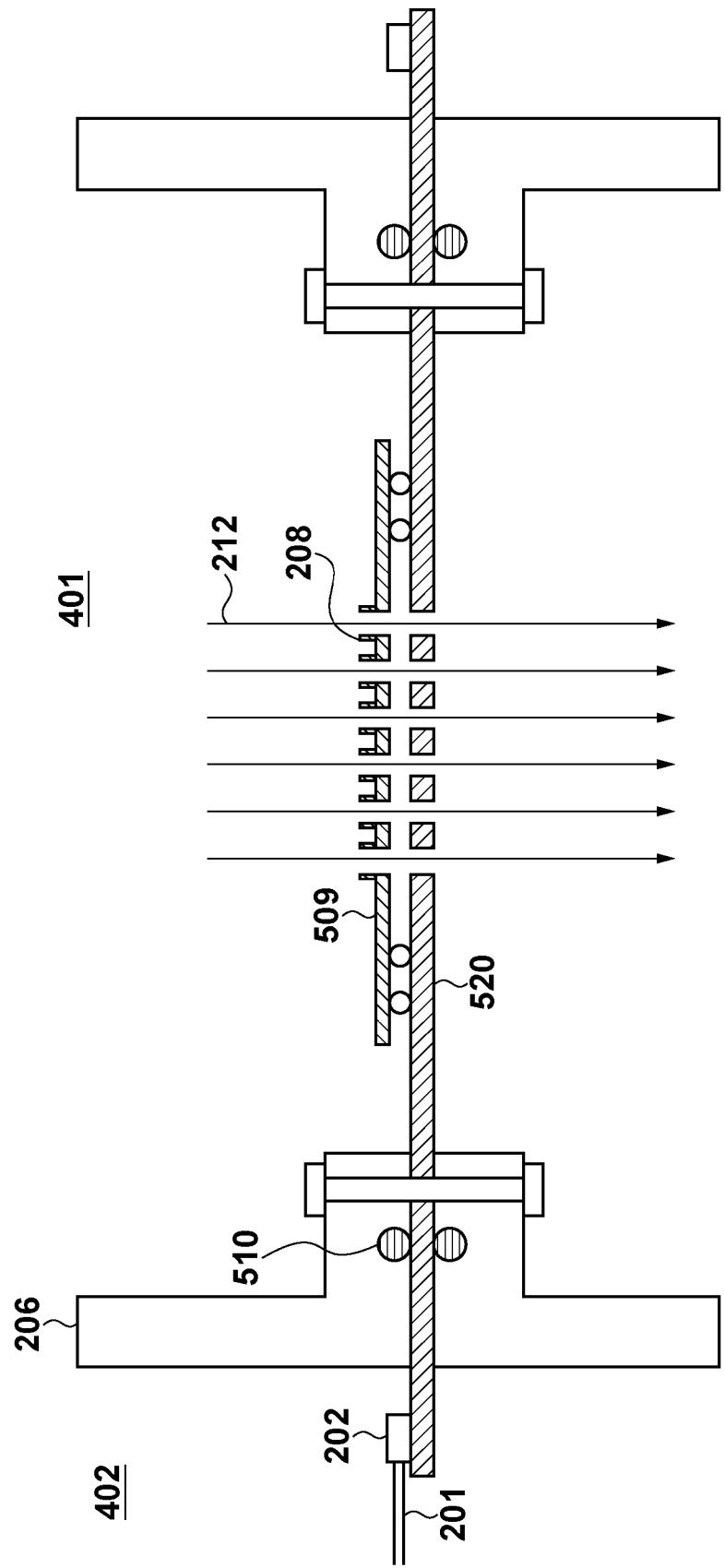
FIG. 15 is a sectional view of the conventional blanking deflector.

FIG. 13 illustrates an embodiment of a processing apparatus (a processing apparatus which performs a predetermined process such as machining, measurement, or inspection for a target object under a reduced pressure or vacuum) other than a drawing apparatus. A photodiode (first device) 301 which detects a laser beam 222 is located in a vacuum space (decompression chamber) 401, and is connected to an amplifier (second device) 306 located in an exterior 402 of the vacuum space via electrodes 205 in a silicon substrate 204 (to be also simply referred to as a substrate 204 hereinafter). A pulse wave is generated by the amplifier 306, is A/D-converted, and is transmitted to a control system (not shown).

Conventionally, as the signal frequency rises, the amount of heat generated by the amplifier 306 increases, so the photodiode 301 cannot detect the amount of laser light with high accuracy due to the influence of this increase. Also, although the amplifier 306 as a heat generation source is cooled by locating it in the exterior 402 of the vacuum space via a vacuum feedthrough, an increase in transmission distance between the photodiode 301 and the amplifier 306 degrades the transmission characteristics and poses a problem in terms of mounting size.

However, as described above, the use of the silicon substrate 204 as a partition to isolate the vacuum space makes it possible to locate the amplifier 306 in the exterior 402 of the vacuum space without increasing the wiring length. Because the thermal contact resistance of the amplifier 306 located in the exterior 402 of the vacuum space decreases, it is possible to sufficiently cool the amplifier 306 using a cooler 209, thereby preventing heat from being transmitted to the photodiode 301. Although a photodiode has been taken as an example in this embodiment, the present invention is applicable to all electronic components (devices) which are placed in the vacuum space, transmit or receive signals to or from each other, and may serve as heat sources.

As described above, in this embodiment, the silicon substrate 204 having a structure in which wiring layers on the opposite sides of the electrodes 205 filling the vias are connected to each other is provided as a partition for the processing apparatus, and the electronic component 301 is mounted or formed on the silicon substrate 204. In this embodiment, this makes it possible to prevent heat from being transmitted to the electronic component 301, form a large number of transmission lines in the vacuum chamber, and improve the frequency characteristics of the transmission lines.

Although a silicon substrate has been taken as an example of the substrate which forms a (vacuum) partition in the above description, the present invention is not limited to this, and substrates made of other materials can be employed as long as they can function as partitions and be provided with feedthrough electrodes.

[Method of Manufacturing Article]

A method of manufacturing an article according to an embodiment of the present invention is suitable for manufacturing an article such as a microdevice such as a semiconductor device or an element having a microstructure. This method can include a step of forming a latent image pattern on a photosensitive agent, coated on a substrate, using the above-mentioned drawing apparatus (a step of drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous in at least one of the performance/quality/productivity/manufacturing cost of an article than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-141220 filed Jun. 24, 2011, which is hereby incorporated by reference herein in its entirety.

What is claimed is:

1. A drawing apparatus which performs drawing on a substrate with a plurality of charged particle beams, the apparatus comprising:
 a blanking deflector located in a vacuum chamber and configured to blank each of the plurality of charged particle beams;
 a device located in an external chamber in which a gas pressure is higher than a gas pressure in the vacuum chamber, and configured to control the blanking deflector; and
 a first substrate facing the blanking deflector,
 wherein the first substrate constitutes a partition which separates the vacuum chamber and the external chamber in a region, of the first substrate, facing the blanking deflector, and includes an electrode which fills a via formed in the region, and the device is electrically connected to the blanking deflector via the electrode.

2. The apparatus according to claim 1, wherein
 the external chamber includes an anterior chamber in which the device is located, and a first intermediate chamber which is located between the anterior chamber and the vacuum chamber and in which a device is located,
 the first intermediate chamber is decompressed to a gas pressure between the gas pressure in the vacuum chamber and a gas pressure in the anterior chamber,
 a partition which separates the first intermediate chamber and the anterior chamber includes a vacuum feedthrough, and
 the device located in the anterior chamber is electrically connected to the blanking deflector via the vacuum feedthrough, the device located in the first intermediate chamber, and the electrode.

3. The apparatus according to claim 1, wherein
 the external chamber includes an anterior chamber in which the device is located, and a first intermediate chamber which is located between the anterior chamber and the vacuum chamber and in which a device is located,
 the first intermediate chamber is decompressed to a gas pressure between the gas pressure in the vacuum chamber and a gas pressure in the anterior chamber,
 a partition which separates the first intermediate chamber and the anterior chamber includes a second substrate including an electrode which fills a via formed in the second substrate, and
 the device located in the anterior chamber is electrically connected to the blanking deflector via the electrode in the second substrate, the device located in the first intermediate chamber, and the electrode in the first substrate.

4. The apparatus according to claim 2, wherein
 the external chamber includes a second intermediate chamber which is located between the first intermediate chamber and the vacuum chamber and in which a device is located, and
 the second intermediate chamber is decompressed to a gas pressure between the gas pressure in the vacuum chamber and the gas pressure in the first intermediate chamber.

5. The apparatus according to claim 3, wherein
 the external chamber includes a second intermediate chamber which is located between the first intermediate chamber and the vacuum chamber and in which a device is located, and
 the second intermediate chamber is decompressed to a gas pressure between the gas pressure in the vacuum chamber and the gas pressure in the first intermediate chamber.

6. The apparatus according to claim 1, further comprising:
 a detector configured to detect the gas pressure in the vacuum chamber and the gas pressure in the external chamber;
 an evacuation device configured to evacuate the vacuum chamber and the external chamber; and
 a controller configured to control the evacuation device based on detection by the detector, so that deformation of the first substrate falls within a tolerance.

7. The apparatus according to claim 1, further comprising:
 an evacuation device configured to evacuate the vacuum chamber,
 wherein another via is formed in the region in the first substrate and
 the evacuation device is configured to evacuate the external chamber through the other via in the first substrate so as to maintain the gas pressure in the external chamber higher than the gas pressure in the vacuum chamber.

8. The apparatus according to claim 1, wherein
 the apparatus is provided with a first transmission line through which a signal is transmitted from the external chamber to the blanking deflector via the electrode in the first substrate, and a second transmission line through which a signal is transmitted from the external chamber to the blanking deflector not via the electrode in the first substrate, and
 a transmission line capacity of the second transmission line is less than a transmission line capacitance of the first transmission line.

9. The apparatus according to claim 1, wherein the device located in the external chamber includes at least one of a photoelectric conversion element, a serial-parallel converter, and a memory.

10. A method of manufacturing an article, the method comprising:
 performing drawing on a substrate using a drawing apparatus which performs drawing on the substrate with a plurality of charged particle beams;
 developing the substrate on which the drawing has been performed; and
 processing the developed substrate,
 wherein the drawing apparatus includes:
 a blanking deflector located in a vacuum chamber and configured to blank each of the plurality of charged particle beams;
 a device located in an external chamber in which a gas pressure is higher than a gas pressure in the vacuum chamber, and configured to control the blanking deflector; and
 a first substrate facing the blanking deflector, and
 wherein the first substrate constitutes a partition which separates the vacuum chamber and the external chamber in a region, of the first substrate, facing the blanking deflector, and includes an electrode which fills a via formed in the region, and
 the device is electrically connected to the blanking deflector via the electrode.

11. A processing apparatus which includes a partition that forms a vacuum chamber, a first device located inside the vacuum chamber, and a second device located outside the vacuum chamber, and performs a process using the first device in the vacuum chamber, the apparatus comprising:
- a substrate which constitutes the partition, and includes an electrode which fills a via formed in a region, of the substrate, serving as the partition,
- wherein the first device and the second device are electrically connected to each other via the electrode.

12. The apparatus according to claim 11, wherein
the first device includes a photodiode, and
the second device includes an amplifier.

13. A drawing apparatus which performs drawing on an object with a plurality of charged particle beams, the apparatus comprising:
- a blanking device located in a vacuum chamber and configured to blank each of the plurality of charged particle beams;
- a control device located in an external chamber in which a gas pressure is higher than a gas pressure in the vacuum chamber, and configured to control the blanking device; and
- a substrate facing the blanking device,
- wherein the substrate constitutes a partition which separates the vacuum chamber and the external chamber in a region, of the substrate, facing the blanking device, and includes an electrode which fills a via formed in the region, and the control device is electrically connected to the blanking device via the electrode.

14. A method of manufacturing an article, the method comprising:
- performing drawing on an object using a drawing apparatus which performs drawing on the object with a plurality of charged particle beams;
- developing the object on which the drawing has been performed; and
- processing the developed object to manufacture the article,
- wherein the drawing apparatus includes:
- a blanking device located in a vacuum chamber and configured to blank each of the plurality of charged particle beams;
- a control device located in an external chamber in which a gas pressure is higher than a gas pressure in the vacuum chamber, and configured to control the blanking device; and
- a substrate facing the blanking device,
- wherein the substrate constitutes a partition which separates the vacuum chamber and the external chamber in a region, of the substrate, facing the blanking device, and includes an electrode which fills a via formed in the region, and the control device is electrically connected to the blanking device via the electrode.

* * * * *